(12) United States Patent
Letertre et al.

(10) Patent No.: US 8,486,771 B2
(45) Date of Patent: Jul. 16, 2013

(54) METHODS OF FORMING RELAXED LAYERS OF SEMICONDUCTOR MATERIALS, SEMICONDUCTOR STRUCTURES, DEVICES AND ENGINEERED SUBSTRATES INCLUDING SAME

(75) Inventors: Fabrice Letertre, Meylan (FR); Bruce Faure, Paris (FR); Michael R. Krames, Los Altos, CA (US); Nathan F. Gardner, Sunnyvale, CA (US)

(73) Assignee: Soitec, Bernin (FR)

( * ) Notice: Subject to any disclaimer, the term of this patent is extended or adjusted under 35 U.S.C. 154(b) by 370 days.

(21) Appl. No.: 12/563,953

(22) Filed: Sep. 21, 2009

(65) Prior Publication Data

US 2010/0176490 A1    Jul. 15, 2010

Related U.S. Application Data

(60) Provisional application No. 61/099,829, filed on Sep. 24, 2008.

(51) Int. Cl.
*H01L 21/00* (2006.01)

(52) U.S. Cl.
USPC ........... 438/149; 438/406; 438/455; 438/458; 438/751; 257/E29.287

(58) Field of Classification Search
USPC .......................... 438/149, 406, 455, 458, 751
See application file for complete search history.

(56) References Cited

U.S. PATENT DOCUMENTS

| | | | |
|---|---|---|---|
| 5,374,564 A | 12/1994 | Bruel et al. | |
| 5,391,257 A | 2/1995 | Sullivan et al. | |
| 5,395,769 A | 3/1995 | Arienzo et al. | |
| 5,401,544 A | 3/1995 | Nakahata et al. | |
| 5,446,330 A | 8/1995 | Eda et al. | |
| 5,448,126 A | 9/1995 | Eda et al. | |
| 5,630,949 A | 5/1997 | Lakin | |

(Continued)

FOREIGN PATENT DOCUMENTS

| | | |
|---|---|---|
| EP | 1052684 | 11/2000 |
| EP | 1246233 A2 | 10/2002 |

(Continued)

OTHER PUBLICATIONS

International Search Report dated Feb. 2, 2010.

(Continued)

*Primary Examiner* — Matthew W Such
*Assistant Examiner* — Robert Carpenter
(74) *Attorney, Agent, or Firm* — TraskBritt

(57) ABSTRACT

Methods of fabricating relaxed layers of semiconductor materials include forming structures of a semiconductor material overlying a layer of a compliant material, and subsequently altering a viscosity of the compliant material to reduce strain within the semiconductor material. The compliant material may be reflowed during deposition of a second layer of semiconductor material. The compliant material may be selected so that, as the second layer of semiconductor material is deposited, a viscosity of the compliant material is altered imparting relaxation of the structures. In some embodiments, the layer of semiconductor material may comprise a III-V type semiconductor material, such as, for example, indium gallium nitride. Methods of fabricating semiconductor structures and devices are also disclosed. Novel intermediate structures are formed during such methods. Engineered substrates include a plurality of structures comprising a semiconductor material disposed on a layer of material exhibiting a changeable viscosity.

25 Claims, 3 Drawing Sheets

U.S. PATENT DOCUMENTS

| | | | |
|---|---|---|---|
| 5,714,395 A | 2/1998 | Bruel | |
| 5,877,070 A | 3/1999 | Goesele et al. | |
| 5,882,987 A | 3/1999 | Srikrishnan | |
| 5,966,620 A | 10/1999 | Sakaguchi et al. | |
| 5,994,207 A | 11/1999 | Henley et al. | |
| 6,010,579 A | 1/2000 | Henley et al. | |
| 6,020,252 A | 2/2000 | Aspar et al. | |
| 6,054,370 A | 4/2000 | Doyle | |
| 6,103,597 A | 8/2000 | Aspar et al. | |
| 6,107,113 A | 8/2000 | Harmand et al. | |
| 6,133,058 A | 10/2000 | Kidoguchi et al. | |
| 6,303,468 B1 | 10/2001 | Aspar et al. | |
| 6,328,796 B1 | 12/2001 | Kub et al. | |
| 6,335,258 B1 | 1/2002 | Aspar et al. | |
| 6,562,127 B1 | 5/2003 | Kud et al. | |
| 6,744,064 B2 | 6/2004 | Lee et al. | |
| 6,756,286 B1 | 6/2004 | Moriceau et al. | |
| 6,809,044 B1 | 10/2004 | Aspar et al. | |
| 6,873,012 B2 * | 3/2005 | Stecher et al. | 257/347 |
| 6,946,365 B2 | 9/2005 | Aspar et al. | |
| RE39,484 E | 2/2007 | Bruel | |
| 7,273,798 B2 | 9/2007 | Lester et al. | |
| 7,879,732 B2 | 2/2011 | Hu et al. | |
| 8,039,869 B2 | 10/2011 | Lester et al. | |
| 2002/0068201 A1 | 6/2002 | Vaudo et al. | |
| 2002/0078881 A1 | 6/2002 | Cuomo et al. | |
| 2002/0197825 A1 | 12/2002 | Usui et al. | |
| 2003/0102473 A1 | 6/2003 | Chason et al. | |
| 2004/0048448 A1 | 3/2004 | Koike et al. | |
| 2004/0192067 A1* | 9/2004 | Ghyselen et al. | 438/763 |
| 2004/0195656 A1 | 10/2004 | Ghyselen et al. | |
| 2004/0209402 A1 | 10/2004 | Chai et al. | |
| 2005/0003641 A1 | 1/2005 | Faure | |
| 2005/0161772 A1 | 7/2005 | Suzuki | |
| 2006/0046325 A1 | 3/2006 | Usui et al. | |
| 2007/0072324 A1 | 3/2007 | Krames et al. | |
| 2008/0211061 A1 | 9/2008 | Atwater, Jr. | |
| 2008/0230802 A1 | 9/2008 | Bakkers et al. | |
| 2010/0087049 A1 | 4/2010 | Kononchuk | |
| 2010/0109126 A1 | 5/2010 | Arena | |
| 2012/0161289 A1 | 6/2012 | Werkhoven | |

FOREIGN PATENT DOCUMENTS

| | | |
|---|---|---|
| EP | 1 278 233 A1 | 1/2003 |
| EP | 1385215 A2 | 1/2004 |
| EP | 1750311 A2 | 2/2007 |
| GB | 2354370 A | 3/2001 |
| WO | 0068473 A1 | 11/2000 |
| WO | 2005004212 A1 | 1/2005 |

OTHER PUBLICATIONS

Yih et al. "Relaxed SiGe layers with high Ge content by compliant substrates" Integration of Heterogeneous Thin-Film Materials and Devices Symposium (Mater. Res. Soc. Sumposium Proceedings vol. 768) Mater. Re. Soc Warrendale, Pa, USA, 2003, 15-19, XP002565240 ISBN:1-55899-705-9.

Hobart et al. "Compliant substrates: a comparative study of the relaxation mechanisms of strained films bonded to high and low viscosity oxides" Journal of Electronic Materials TMS; IEEE USA, vol. 29, No. 7, Jul. 2000, pp. 897-900 XP002565241 ISSN: 0361-5235.

Singapore Search Report for Singapore Application No. 2009051467 dated Sep. 9, 2009, 7 pages.

Singapore Search Report for Singapore Application No. 2009051467 dated Sep. 9, 2010, 7 pages.

Hobart et al., "Compliant Substrates: A Comparative Study of the Relaxation Mechanisms of Strained Films Bonded to High and Low Viscosity Oxides", J. Elect. Materials, vol. 29, No. 7, (2000).

Yin et al., "Strain Relaxation of SiGe Islands on Compliant Oxide," J. App. Physics, 91(12):9716-9722 (2002).

Christensen, A General Measure for the Ductility of Materials, Journal of Materials Science Letters, Vol. 18 (1999) pp. 1371-1373.

Feng et al., Stress Generation and Relaxation During Film Heteroepitaxy on a Compliant Substrate with a Viscoelastice Glass Interlayer, Mat. Res. Soc. Symp. Proc. vol. 696, 2002, Materials Research Society, pp. N3.19.1-N3.19.6.

Hansen et al., Development of a Glass-Bonded Compliant Substrate, Journal of Crystal Growth, vol. 195 (1998) pp. 144-150.

International Search Report for International Application No. PCT/US2009/057734 mailed Feb. 22, 2010, 4 pages.

International Search Report for International Application No. PCT/US2009/059939 mailed Feb. 22, 2010, 4 pages.

International Written Opinion for International Application No. PCT/US2009/057734 mailed Feb. 22, 2010, 8 pages.

International Written Opinion for International Application No. PCT/US2009/059939, mailed Feb. 22, 2010, 8 pages.

Moran et al., Kinetics of Strain Relaxation in Semiconductor Films Grown on Borosilicate Glass-Bonded Substrates, Journal of Electronic Materials, vol. 30, No. 7, 2001, pp. 802-806.

Nam et al., Lateral Epitaxy of Low Defect Density GaN Layers Via Organometallic Vapor Phase Epitaxy, Appl. Phys. Lett., vol. 71, No. 18, Nov. 3, 1997, pp. 2638-2640.

Yin et al., Buckling Suppression of SiGe Islands on Compliant Substrates, Journal of Applied Physics, Nov. 15, 2003, vol. 94, No. 10, pp. 6875-6882.

Yin et al., Relaxed SiGe Layers with High Ge Content by Compliant Substrates, Integration of Heterogeneous Thin-Film Materials and Devices Symposium, Mater. Res. Soc. Symposium Proceedings vol. 768, 2003, 6 pages.

Zheleva et al., Dislocation Density Reduction Via Lateral Epitaxy in Selectively Grown GaN Structures, Appl. Phys. Lett., vol. 71, No. 17, Oct. 27, 1997, pp. 2472-2474.

Chen et al., A Systematic Study on Group III-Nitride Thin Films with Low Temperature Deposited via MOCVD, Optical Materials, vol. 26 (2004), pp. 417-420.

French et al., Reflow of BPSG for Sensor Applications, J. Micromech. Microeng., Vo. 3 (1993), pp. 135-137.

Kraus et al., Growth and Characterization of InGaN by RF-MBE, Journal of Crystal Growth, vol. 323 (2011) pp. 72-75.

Syms et al., Optimization of Borophosphosilicate Glass Compositions for Silica-on-Silicon Integrated Optical Circuits Fabricated by the Sol-Gel Process, Electronics Letters, vol. 32, No. 13, Jun. 20, 1996, pp. 1233-1234.

Zheng et al, Temperature Dependence of the Material Characterizing Ductility Factor in the New Damage Theory, International Journal of Fracture, vol. 76, 1996, pp. R77-R81.

European Office Action for European Application No. 09792798.2 dated Jan. 24, 2012, 5 pages.

Chinese Office Action and Search Report for Chinese Application No. 200980136825.3 dated Dec. 4, 2012, 4 pages.

International Preliminary Report on Patentability for PCT/US2009/057734, dated Mar. 29, 2011.

* cited by examiner

US 8,486,771 B2

METHODS OF FORMING RELAXED LAYERS OF SEMICONDUCTOR MATERIALS, SEMICONDUCTOR STRUCTURES, DEVICES AND ENGINEERED SUBSTRATES INCLUDING SAME

CROSS-REFERENCE TO RELATED APPLICATION

This application claims the benefit under 35 U.S.C. §119(e) of U.S. Provisional Application No. 61/099,829, filed Sep. 24, 2008, which is incorporated herein by reference.

FIELD OF THE INVENTION

The present invention generally relates to the fabrication of semiconductor structures or devices using engineered substrates, to intermediate structures formed during the fabrication of semiconductor structures or devices, and to engineered substrates for use in the fabrication of semiconductor structures or devices.

BACKGROUND OF THE INVENTION

Substrates that include one or more layers of semiconductor material are used to form a wide variety of semiconductor structures and devices including, for example, integrated circuit (IC) devices (e.g., logic processors and memory devices), radiation emitting devices (e.g., light emitting diodes (LEDs), resonant cavity light emitting diodes (RCLEDs), and vertical cavity surface emitting lasers (VCSELs)), and radiation sensing devices (e.g., optical sensors). Such semiconductor devices are conventionally formed in a layer-by-layer manner (i.e., lithographically) on and/or in a surface of a semiconductor substrate.

Historically, a majority of such semiconductor substrates that have been used in the semiconductor device manufacturing industry have comprised thin discs or "wafers" of silicon material. Such wafers of silicon material are fabricated by first forming a large, generally cylindrical, silicon single-crystal ingot and subsequently slicing the single-crystal ingot perpendicularly to its longitudinal axis to form a plurality of silicon wafers. Such silicon wafers may have diameters as large as about thirty centimeters (30 cm) or more (about twelve inches (12 in) or more). Although silicon wafers generally have thicknesses of several hundred microns (e.g., about 700 microns) or more, only a very thin layer (e.g., less than about three hundred nanometers (300 nm)) of the semiconductor material on a major surface of the silicon wafer is actually used to form active devices on the silicon wafer.

It has been discovered that the speed and power efficiency of semiconductor devices can be improved by electrically insulating the portion of the semiconductor material on a semiconductor substrate that is actually used to form the semiconductor devices from the remaining bulk semiconductor material of the substrate. As a result, so-called "engineered substrates" have been developed that include a relatively thin layer of semiconductor material (e.g., a layer having a thickness of less than about three hundred nanometers (300 nm)) disposed on a layer of dielectric material (e.g., silicon dioxide ($SiO_2$), silicon nitride ($Si_3N_4$), or aluminum oxide ($Al_2O_3$)). Optionally, the layer of dielectric material may be relatively thin (e.g., too thin to enable handling by conventional semiconductor device manufacturing equipment), and the semiconductor material and the layer of dielectric material may be disposed on a relatively larger host or base substrate to facilitate handling of the overall engineered substrate by manufacturing equipment. As a result, the base substrate is often referred to in the art as a "handle" or "handling" substrate. The base substrate may also comprise a semiconductor material.

A wide variety of engineered substrates are known in the art and may include semiconductor materials such as, for example, silicon (Si), germanium (Ge), III-V type semiconductor materials, and II-VI type semiconductor materials. For example, an engineered substrate may include an epitaxial layer of III-V type semiconductor material formed on a surface of a base substrate, such as, for example, aluminum oxide ($Al_2O_3$) (which may be referred to as "sapphire"). Using such an engineered substrate, additional layers of material may be formed and processed (e.g., patterned) over the epitaxial layer of III-V type semiconductor material to form one or more devices on the engineered substrate.

Due to a natural tendency of atoms of different material layers to align with one another when one crystal is formed on another crystal, when a layer of semiconductor material is formed (e.g., epitaxially grown or through layer transfer techniques) over another layer of material (e.g., an underlying layer of dielectric material or an underlying layer of a different semiconductor material), the crystal tends to stretch or "strain" to align with the atoms in the underlying material. The formation and use of strained layers of semiconductor material is difficult because these strained layers develop defects, such as dislocations, due to mismatch of the lattice parameters between adjacent materials. Depending on its particular composition, the layer of semiconductor material may only be grown to a particular thickness, often referred to as a "critical thickness," before defects and separation of compositional phases begin to develop. The critical thickness of a material is dependent on the lattice structure of the underlying material, the composition of the semiconductor material, and the growth conditions under which the layer of semiconductor material is formed. Dislocations form above a critical thickness when a lattice parameter mismatch exists between the layer of semiconductor material and the underlying substrate material. When forming these layers epitaxially, both a high doping concentration and an increased material thickness are desirable to reduce electrical resistivity. However, as the concentration of dopant and the thickness of the layer of semiconductor material is increased, preserving a crystal structure having low-defect density becomes increasingly difficult.

For example, indium gallium nitride ($In_xGa_{1-x}N$) devices may be formed on an engineered substrate by growing one or more epitaxial device layers each comprising indium gallium nitride ($In_xGa_{1-x}N$) (which together form a "device structure stack") on a seed layer of gallium nitride formed on the engineered substrate. Any mismatch in the crystal lattices of the adjacent layers of indium gallium nitride may induce strain in the crystal lattice of one or more of the indium gallium nitride device layers, which may effectively limit the thickness of the indium gallium nitride device layer and/or the concentration of indium in the indium gallium nitride device layer. Lattice strain is more problematic in indium gallium nitride device layers having higher indium content and increased thicknesses. The presence of such lattice strain in a layer of semiconductor material may be undesirable for a number of reasons. For example, the presence of lattice strain in a layer of semiconductor material may result in an increased density of defects (e.g., lattice dislocations) in the layer of semiconductor material, undesirable morphology at the surface of the layer of semiconductor material, and may even result in the formation of cracks in the layer of semiconductor material. Furthermore, the presence of lattice strain in a layer of semiconductor material may facilitate the onset of undesirable separation of material phases within the layer of semiconductor material. Unfortunately, currently available substrate materials lattice matched to indium gallium nitride are impractical for high quality materials deposition purposes.

It is difficult to form an indium gallium nitride seed layer on the surface of an engineered substrate in such a manner that the indium gallium nitride seed layer has a lattice parameter that will match that of an indium gallium nitride device layer to be formed thereover. As a result, the crystal lattice of the overlying device layer of indium gallium nitride will be strained upon formation thereof when using the underlying seed layer of indium gallium nitride.

U.S. Pat. No. 7,273,798, issued Sep. 25, 2007 to Lester et al., discloses a gallium nitride device substrate and methods of fabricating the gallium nitride device substrate including a lattice parameter altering element. As disclosed therein, a semiconductor structure may include a substrate, a layer of gallium nitride and a layer containing a lattice parameter altering element. The lattice parameter altering element is disclosed as aluminum or indium. Due to lattice mismatch of the layer of gallium nitride and the layer containing a lattice parameter altering element, the layer containing a lattice parameter altering element is grown in a strained condition so that its lattice parameter conforms to that of the layer of gallium nitride.

Hobart et al., "Compliant Substrates: A Comparative Study of the Relaxation Mechanisms of Strained Films Bonded to High and Low Viscosity Oxides", J. Elect. Materials, Vol. 29, No. 7, (2000), discloses a method of fabricating a compliant substrate by transferring SiGe islands to a viscous borophosphosilicate glass (BPSG) compliant film. More specifically, a compressively strained heteroepitaxial $Si_{0.7}Ge_{0.3}$ film bonded to high and low viscosity glass compliant layers were formed by transferring the $Si_{0.7}Ge_{0.3}$ film to silicon substrates covered with borophosphosilicate glass. At temperatures of near 800° C., relaxation and buckling were observed in the $Si_{0.7}Ge_{0.3}$ film overlying the borophosphosilicate glass. The $Si_{0.7}Ge_{0.3}$ film was patterned into small areas to eliminate buckling.

Yin et al., "Strain Relaxation of SiGe Islands on Compliant Oxide," J. App. Physics, 91(12):9716-9722 (2002), discloses a method of forming an epitaxial $Si_{0.7}Ge_{0.3}$ film by transferring the epitaxial $Si_{0.7}Ge_{0.3}$ film to borophosphosilicate glass according to a wafer-bonding technique. After transferring the epitaxial $Si_{0.7}Ge_{0.3}$ film, the $Si_{0.7}Ge_{0.3}$ film is patterned into arrays of square islands. The $Si_{0.7}Ge_{0.3}$ islands on borophosphosilicate glass are annealed resulting in lateral expansion and relaxation. Changing the viscosity of the borophosphosilicate glass did not favor either lateral expansion of the islands or buckling within the islands.

In view of the above, there is a need for methods that can be used to reduce lattice parameter mismatch between adjacent layers, and the resulting lattice strain therein, in semiconductor structures and devices such as, for example, engineered substrates, integrated circuit (IC) devices, radiation emitting devices, and radiation sensor devices.

BRIEF SUMMARY OF THE INVENTION

In some embodiments, the present invention includes methods of fabricating semiconductor structures or devices. The methods may include altering a viscosity of a material underlying a strained layer of semiconductor material to cause the strained layer to relax. After forming a plurality of structures comprising a semiconductor material, each of which protrudes from a layer of material, the viscosity of the layer of material may be altered by, for example, depositing a another layer of semiconductor material over the plurality of structures at a temperature sufficient to reflow the layer of material. The methods may further include forming a layer of semiconductor material over a base layer, affixing the layer of semiconductor material to at least another layer of material, separating the layer of semiconductor material and the base layer and removing a portion of the layer of semiconductor material to expose regions of the another layer of material between each of a plurality of structures comprising the semiconductor material.

The present invention includes additional embodiments of methods of fabricating semiconductor structures or devices. An epitaxial layer of III-V type semiconductor material may be formed on a layer of compliant material overlying a substrate. Portions of the layer of III-V type semiconductor material may be removed to form a plurality of structures, each structure separated from adjacent structures by exposed regions of the layer of compliant material. After forming the plurality of structures, another layer of an III-V type semiconductor material may be deposited at a temperature sufficient to decrease the viscosity of the layer of compliant material to cause relaxation of each of the plurality of structures.

In yet further embodiments, the present invention includes methods of forming engineered substrates. For example, a layer of indium gallium nitride may be grown or otherwise formed on a first substrate that includes a compliant material. A second substrate may be attached to the layer of indium gallium nitride on a side thereof opposite the substrate and, thereafter, the first substrate may be removed from the layer of indium gallium nitride. Portions of the layer of indium gallium nitride may be removed to form a plurality of structures. Another layer of indium gallium nitride having an indium content greater than that of the indium gallium nitride structures may be deposited while, substantially simultaneously, a viscosity of the layer of compliant material may be decreased to relax the indium gallium nitride material. For example, the compliant material may be borophosphosilicate glass and the another layer of indium gallium nitride may be deposited at a temperature of above about 600° C. so that lattice strain within the indium gallium nitride may be substantially reduced.

Additional embodiments of the present invention include intermediate structures formed during methods of fabricating semiconductor structures or devices as described herein. The intermediate structures may include a plurality of structures comprising a layer of $In_{0.25}Ga_{0.75}N$ overlying a layer of $In_{0.1}Ga_{0.9}N$ and being disposed on and attached to a base substrate. A layer of material exhibiting a viscosity sufficient for reflow may be disposed between the plurality of III-V type semiconductor structures and the base substrate.

Embodiments of the present invention also include engineered substrates. The engineered substrates may include a plurality of structures comprising a semiconductor material disposed on a layer of material overlying a substrate, wherein the layer of material exhibits a changeable viscosity. For example, the viscosity of the layer of material may be decreased at a temperature of greater than or equal to a deposition temperature of the semiconductor material. The plurality of structures may each include a substantially relaxed layer of $In_{0.25}Ga_{0.75}N$ overlying a substantially relaxed layer of $In_{0.1}Ga_{0.9}N$.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the description of the invention when read in conjunction with the accompanying drawings, in which:

DETAILED DESCRIPTION OF THE INVENTION

Figure 1:
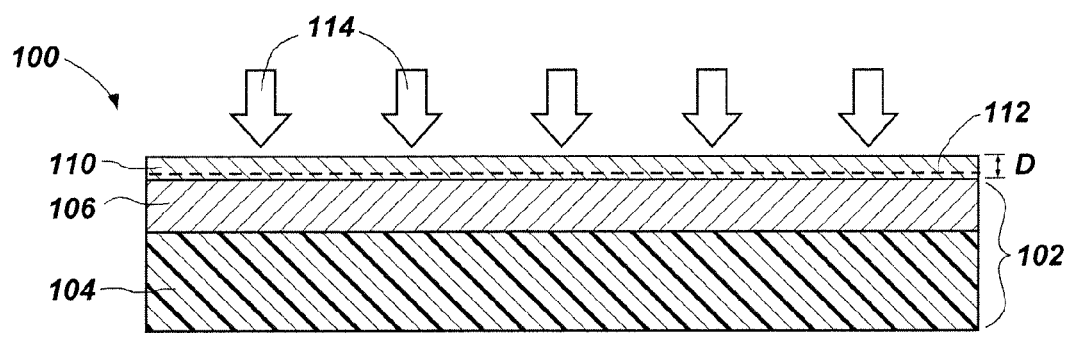
FIG. 1 is a simplified cross-sectional view of an intermediate structure that may be formed during embodiments of methods of the present invention and that includes a layer of semiconductor material and an intermediate layer of semiconductor material attached to a sacrificial substrate.

The illustrations presented herein are not meant to be actual views of any particular material, apparatus, system, or method, but are merely idealized representations that are employed to describe the present invention. Additionally, elements common between figures may retain the same numerical designation.

As used herein, the term "III-V type semiconductor material" means and includes any material predominantly comprised of one or more elements from group IIIA of the periodic table (B, Al, Ga, In, and Tl) and one or more elements from group VA of the periodic table (N, P, As, Sb, and Bi).

As used herein, the term "II-VI type semiconductor material" means and includes any material predominantly comprised of one or more elements from group IIB of the periodic table (Zn, Cd, and Hg) and one or more elements from group VIB of the periodic table (O, S, Se, Te, and Po).

As used herein, the term "critical thickness," when used with respect to a material, means maximum thickness above which the formation of defects, such as dislocations, within the material becomes energetically favorable.

As used herein, the term "engineered substrate," in its broadest sense, means and includes any substrate comprising two or more layers of material and that is intended to be used as a substrate for the fabrication of one or more semiconductor device thereon. Engineered substrates include, for example, semiconductor-on-insulator type substrates.

As used herein, the term "epitaxial layer of material," means a layer of material that is at least substantially a single crystal of the material and that has been formed such that the single crystal exhibits a known crystallographic orientation.

As used herein, the term "growth lattice parameter," when used with respect to an epitaxial layer of semiconductor material, means an average lattice parameter exhibited by the layer of semiconductor material as the layer of semiconductor material is epitaxially grown at an elevated temperature.

As used herein, the term "lattice strain," when used with respect to a layer of material, means strain of the crystal lattice in directions at least substantially parallel to the plane of the layer of material and may be compressive strain or tensile strain. Similarly, the term "average lattice parameter," when used with respect to a layer of material, means the average lattice parameters in dimensions at least substantially parallel to the plane of the layer of material.

Similarly, the term "strained" is used to indicate that the crystal lattice has been deformed (e.g., stretched or compressed) from the normal spacing for such material so that its lattice spacing is different than what would normally be encountered for such material in a homogeneous relaxed crystal.

As used herein, the term "lattice constant" means and includes the distance between atoms of a unit cell measured in the plane of the surface.

The term "viscosity" as used herein means and includes the resistance of an amorphous material against deformation or flow, which may be a result of internal friction.

Each of the terms "relax" or "relaxed" as used herein means and includes any layer of semiconductor material which has an unstrained crystallographic structure comprising asymmetric units (such as atoms or molecules) oriented in an energetically favorable manner. The term "relaxing" means and includes changing the position of atoms in a material layer relative to the bulk positions so that the lattice strain within the material is at least partially relieved and the material nears or reaches its equilibrium lattice constant.

As used herein, the term "reflow" means and includes heating or otherwise treating a material such that it is softened or has a decreased viscosity so that it may redistribute itself under the action of its own weight.

Embodiments of the present invention include methods and structures that facilitate the fabrication of layers of semiconductor material (such as, for example, epitaxial layers of III-V type semiconductor materials on engineered substrates) that have controlled and/or selected degrees of lattice strain and controlled and/or selected average lattice parameters. Example embodiments of methods of fabricating semiconductor structures or devices that include such layers of semiconductor material are described below with reference to FIGS. 1 through 8.

Referring to FIG. 1, a first intermediate structure 100 may be fabricated that includes a layer of semiconductor material 110 attached to a sacrificial substrate 102. The sacrificial substrate 102 may comprise a homogenous or heterogeneous composite material such as, for example, sapphire. The layer of semiconductor material 110 comprises the layer in which it is desired to reduce the level of compressive and/or tensile strain, and that may ultimately be used as, for example, a seed layer for forming one or more additional layers of semiconductor material thereon as part of the fabrication of an active semiconductor device.

In some embodiments, the layer of semiconductor material 110 may comprise a single epitaxial layer, or multiple epitaxial layers of a semiconductor material. Furthermore, in some embodiments, the layer of semiconductor material 110 may comprise an epitaxial layer of III-V type semiconductor material. By way of non-limiting example, the layer of semiconductor material 110 may comprise at least one of an epitaxial layer of gallium nitride, an epitaxial layer of indium gallium nitride ($In_xGa_{1-x}N$) and an epitaxial layer of aluminum gallium nitride ($Al_xGa_{1-x}N$) wherein x may represent any number between about 0.01 and about 0.15 such as, for example, 0.05 or 0.10.

As shown in FIG. 1, the sacrificial substrate 102 includes a base material 104 and, optionally, an intermediate layer of semiconductor material 106 that is ultimately disposed between the layer of semiconductor material 110 and the base material 104. The intermediate layer of semiconductor material 106 may include a single layer of semiconductor material or multiple layers of semiconductor material and may be used, for example, as a seed layer for forming the layer of semiconductor material 110 thereon when it is difficult or impossible to form the layer of semiconductor material 110 directly on the base material 104 of the sacrificial substrate 102. The figures are not shown to scale, and, in actuality, the intermediate layer of semiconductor material 106 and the layer of semiconductor material 110 may be relatively thin in relation to a thickness of the base material 104 of the sacrificial substrate 102.

By way of example and not limitation, the intermediate structure 100 may comprise a single intermediate layer of semiconductor material 106 formed on the base material 104 of the sacrificial substrate 102, and the layer of semiconductor material 110 may be formed on the intermediate layer of semiconductor material 106. As one particular non-limiting example, the intermediate layer of semiconductor material 106 may comprise a single epitaxial layer of gallium nitride (GaN), and the layer of semiconductor material 110 may comprise an epitaxial layer of indium gallium nitride ($In_xGa_{1-x}N$).

To form the intermediate structure 100 shown in FIG. 1, the intermediate layer of semiconductor material 106 may be epitaxially grown or otherwise formed over a major surface of the base material 104, after which the layer of semiconductor material 110 may be epitaxially grown or otherwise formed over the intermediate layer of semiconductor material 106. In additional embodiments, the layer of semiconductor material 110 may, optionally, be formed directly on the base material 104 without including the intermediate layer of semiconductor material 106.

In some embodiments, the intermediate layer of semiconductor material 106 may include one or more layers of semiconductor material such as, for example, a III-V type semiconductor material and may be formed to have a thickness sufficient for epitaxial growth of additional layers of semiconductor material thereon. By way of a non-limiting example, the intermediate layer of semiconductor material 106 (which may comprise, for example, a layer of gallium nitride), may be formed to a thickness of between about 0.01 μm to about 100 μm and may be doped or undoped. The intermediate layer of semiconductor material 106 may be deposited using various methods known in the art such as, for example, hydride vapor phase epitaxy (HVPE), metalorganic vapor phase epitaxy (MOVPE), and molecular beam epitaxy (MBE). Additionally, various methods may be used in forming the intermediate layer of semiconductor material 106 to reduce the density of dislocations therein, such as, for example, epitaxial lateral over-growth (ELO), facet-initiated epitaxial lateral over-growth (FIELO), and in-situ masking.

In additional embodiments, the intermediate layer of semiconductor material 106 may be bonded or attached to the sacrificial substrate 102 using techniques known in the art of integrated circuit fabrication, such as, for example, thermal bonding, thermal compression bonding or thermal ultrasonic bonding. As a non-limiting example, the intermediate layer of semiconductor material 106 and the base material 104 may be bonded together by abutting them against one another, and maintaining them at an elevated temperature (selected to impart a selected lattice parameter to the layer of semiconductor material 110) (e.g., at least above one hundred degrees Celsius (100° C.)) and pressure for a sufficient amount of time.

Referring still to FIG. 1, the layer of semiconductor material 110 may be formed on the intermediate layer of the semiconductor material 106 using various methods known in the art. By way of non-limiting example, the layer of semiconductor material 110 may be a pseudomorphically strained indium gallium nitride layer which is grown on the intermediate layer of semiconductor material 106 using a method such as metalorganic chemical vapor deposition (MOCVD). To prevent further defects by inhibiting relaxation through defect formation and phase separation, the layer of semiconductor material 110 may be formed with a thickness of less than a critical thickness thereof, such as, for example, between about 10 nm and about 1000 nm. The critical thickness of the layer of semiconductor material 110 may be determined based on variables such as, for example, chemical composition and growth conditions which are known in the art and not described in detail herein.

Figure 2:
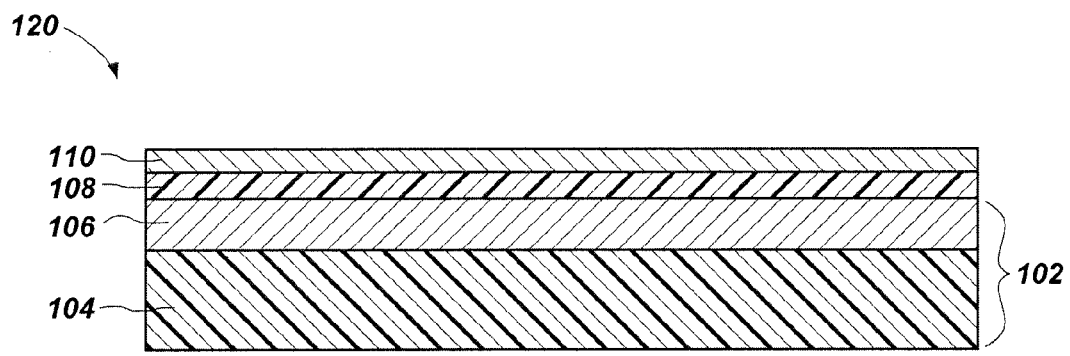
FIG. 2 is a simplified cross-sectional view of an intermediate structure that may be formed during embodiments of methods of the present invention and that includes a layer of semiconductor material and an optional dielectric material attached to a sacrificial substrate.

As shown in FIG. 2, in some embodiments, an intermediate structure 120 may optionally include a layer of dielectric material 108 overlying the base material 104 of the sacrificial substrate 102, and the layer of semiconductor material 110 may be formed on the layer of dielectric material 108 to form the intermediate structure 120. The layer of dielectric material 108 may, optionally, be formed over a major surface of the base material 104. The layer of dielectric material 108 may include, for example, silicon oxynitride (SiON), silicon nitride ($Si_3N_4$), or silicon dioxide ($SiO_2$), and may be formed using, for example, chemical vapor deposition (CVD), physical vapor deposition (PVD), or atomic layer deposition (ALD). The layer of semiconductor material 110 may optionally be transferred, for example by bonding processes, or otherwise formed on the layer of dielectric material 108. The embodiment of FIG. 2 is particularly suited when material 110 is polar, and the final structure should exhibit a given final polarity.

In certain embodiments, the layer of semiconductor material 110 is grown or formed as m-plane or a-plane material, rather than as c-plane material. M-plane and a-plane III-nitride materials are non-polar orientations, i.e., orientations without gallium or nitrogen faces. Accordingly, non-polar semiconductor material 110 orientations need not be bonded twice, as described in the embodiment illustrated by intermediate structure 120 of FIG. 2.

Figure 3:
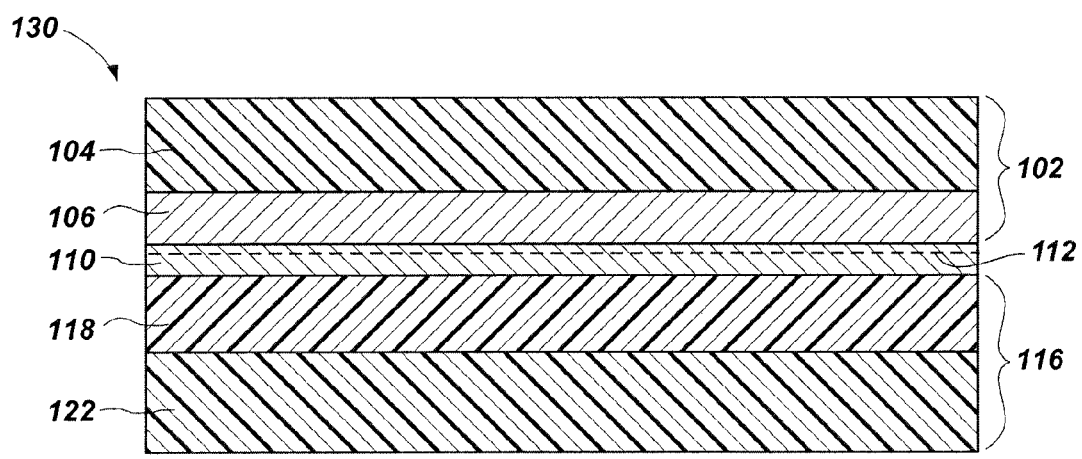
FIG. 3 is a simplified cross-sectional view of another intermediate structure that may be formed during embodiments of methods of the present invention and that includes a layer of semiconductor material attached to both a sacrificial substrate and a bonding substrate.

Referring to FIG. 3, on a side opposite the sacrificial substrate 102, the layer of semiconductor material 110 may be bonded or attached to a bonding substrate 116 to form an intermediate structure 130. The bonding substrate 116 may comprise a support material 122 and a layer of compliant material 118 that is ultimately disposed between the support material 122 and the layer of semiconductor material 110.

The support material 122 may comprise a homogenous material or a heterogeneous (i.e., composite) material which provides mechanical support for the overlying layer of compliant material 118. In some embodiments, the support material 120 may comprise a material having the same or substantially similar thermal characteristics as the base material 104. By way of non-limiting example, the support material 120 may comprise sapphire, silicon, III-Arsenides, quartz ($SiO_2$), fused silica ($SiO_2$) glass, a glass-ceramic composite material (such as, for example, that sold by Schott North America, Inc. of Duryea, Pa. under the trademark ZERODUR®), a fused silica glass composite material (such as, for example, $SiO_2$—$TiO_2$ or $Cu_2$—$Al_2O_3$—$SiO_2$), aluminum nitride (AlN) or silicon carbine (SiC).

The layer of compliant material 118 may be used to facilitate bonding of the bonding substrate 116 to the layer of semiconductor material 110 and may comprise, for example, a material having a glass transition temperature ($T_g$) of less than or equal to about a deposition temperature of the layer of semiconductor material 110. The layer of compliant material 118 may have a thickness in a range extending from about 0.1 μm to about 10 μm and, more particularly, about 1 μm to about 5 μm. By way of non-limiting example, the layer of compliant material 118 may comprise at least one of an oxide, a phosphosilicate glass (PSG), borosilicate (BSG), a borophosphosilicate glass (BPSG), a polyimide, a doped or undoped quasi-inorganic siloxane spin-on-glass (SOG), an inorganic spin-on-glass (i.e., methyl-, ethyl-, phenyl-, or butyl), and a doped or undoped silicate. By way of non-limiting example, the bonding substrate 116 and the layer of semiconductor material 110 may be bonded together by abutting them against one another, and maintaining them at an elevated temperature (selected to impart a selected lattice parameter to the layer of semiconductor material 110) (e.g., at least above one hundred degrees Celsius (100° C.)) and pressure for a sufficient amount of time.

In embodiments in which the layer of semiconductor material 110 comprises an epitaxial layer of indium gallium nitride ($In_xGa_{1-x}N$) and the intermediate layer of semiconductor material 106 comprises gallium nitride (GaN), the bonding substrate 116 may be bonded to the layer of indium gallium nitride at a temperature of, for example, about eight hundred degrees Celsius (800° C.) to cause the pseudomorphically strained layer of indium gallium nitride to be stretched such that its average lattice parameter is at least substantially equal to its unstrained average lattice parameter.

Figure 4:
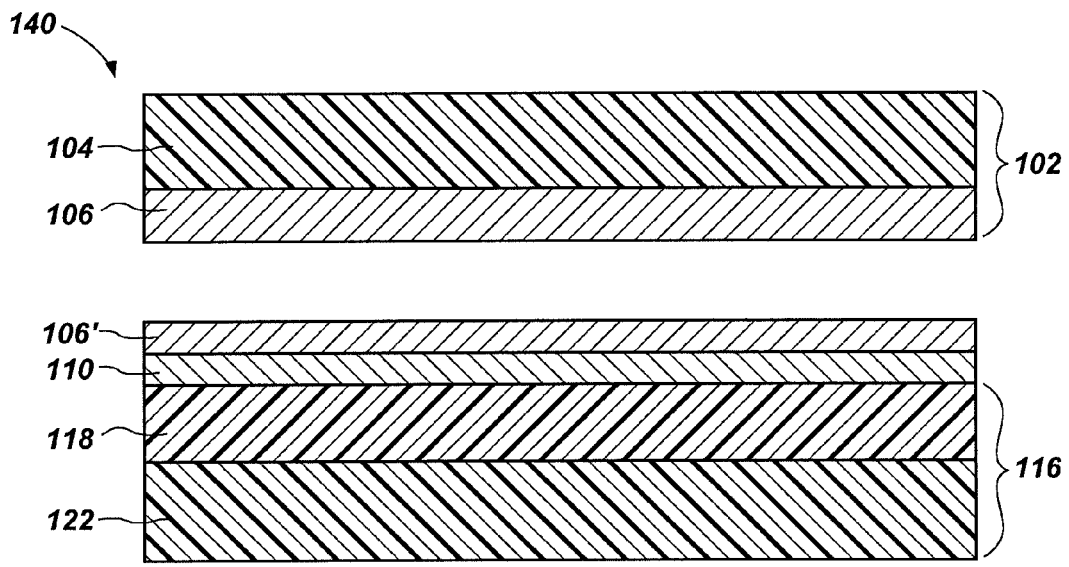
FIG. 4 is a simplified cross-sectional view illustrating delamination in an embodiment of a method of the present invention of the intermediate structure of FIG. 3.

As shown in FIG. 4, after bonding the layer of semiconductor material 110 to the bonding substrate 116, the layer of semiconductor material 110, together with the bonding substrate 116, may be separated from the sacrificial substrate 102 (or the sacrificial substrate 102 may be separated from the layer of semiconductor material 110). Optionally, the intermediate layer of semiconductor material 106, together with the layer of semiconductor material 110 and the bonding substrate 116, may be separated from the base material 104. Separation of the sacrificial substrate 102 from the intermediate layer of semiconductor material 106, or separation of the sacrificial substrate 102 from the layer of semiconductor material 110, may be performed by various chemical, thermal, or mechanical processes, such as, for example, by a grinding process, an etching process, a polishing process, or a laser lift-off process. The method may be performed to remove the entire layer of semiconductor material 110 from the sacrificial substrate 102, or only a portion thereof. In embodiments utilizing the sacrificial substrate of FIG. 2, layer 110 can be separated or detached from base material 104 by removing the base material 104 using a process such as, for example, an etching process, a grinding or planarization process, or a laser irradiation process and detaching at the level of the dielectric material 108.

By way of example and not limitation, the process known in the industry as the SMARTCUT® process may be used to separate the base material 104 and, optionally, the intermediate layer of semiconductor material 106, from the layer of semiconductor material 110. Such processes are described in detail in, for example, U.S. Pat. No. RE39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., and U.S. Pat. No. 6,946,365 to Aspar et al., the disclosures of each of which are incorporated herein in their entirety by this reference.

Referring again to FIG. 1, a plurality of ions (e.g., hydrogen or inert gas ions) may be implanted into the intermediate structure 100. For example, ions may be implanted into the intermediate structure 100 from an ion source (not shown) positioned on a side of the intermediate structure 100 adjacent the layer of semiconductor material 110. As represented by the directional arrows 114 shown in FIG. 1, ions may be implanted into the intermediate structure 100 along a direction substantially perpendicular to the layer of semiconductor material 110. As known in the art, the depth at which the ions are implanted into the intermediate structure 100 is at least partially a function of the energy with which the ions are implanted into the intermediate structure 100. Generally, ions implanted with less energy will be implanted at relatively shallower depths, while ions implanted with higher energy will be implanted at relatively deeper depths.

As a non-limiting example, ions may be implanted into the intermediate structure 100 with a predetermined energy selected to implant the ions at a desired depth D within the intermediate structure 100. As known in the art, inevitably at least some ions may be implanted at depths other than the desired implantation depth, and a graph of the concentration of the ions as a function of depth into the intermediate structure 100 from the exposed surface of the layer of semiconductor material 110 may exhibit a generally bell-shaped (symmetric or asymmetric) curve having a maximum at the desired implantation depth. Upon implantation into the intermediate structure 100, the ions may define an ion implant layer 112 within the intermediate structure 100. The ion implant layer 112 may comprise a layer or region within the intermediate structure 100 that is aligned with (e.g., centered about) the plane of maximum ion concentration with the intermediate structure 100. The ion implant layer 112 may define a zone of weakness within the intermediate structure 100 along which the intermediate structure 100 may be cleaved or fractured in a subsequent process, as described in further detail below.

In some embodiments of the present invention, the ion implant layer 112 may be disposed in one or both of the layers of semiconductor material 110 and the intermediate layer semiconductor material 106. In other words, the ion implant layer 112 may be disposed entirely within the layer of semiconductor material 110, as shown in FIG. 1, or partially within the layer of semiconductor material 110 and partially within the intermediate layer of semiconductor material 106 (not shown). As one particular non-limiting example, in some embodiments, the ion implant layer 112 may extend into the layer of semiconductor material 110 a depth between about 100 nm and about 300 nm. In additional embodiments, the ion implant layer 112 may extend into the intermediate layer of semiconductor material 106.

Referring again to FIG. 4, after attaching the bonding substrate 116 to the layer of semiconductor material 110 on a side thereof opposite the base substrate 102 to form the intermediate structure 130, as previously described with reference to FIG. 3, the intermediate structure 130 may be subjected to a thermal treatment process to cause the intermediate structure 130 to cleave or fracture along the ion implant layer 112, thereby forming the intermediate structure 140 shown in FIG. 4. In other words, the layer of semiconductor material 110 and, optionally, a portion 106' of the underlying intermediate layer of semiconductor material 106 may be delaminated from the remaining portion of the intermediate layer of semiconductor material 106 and the underlying base substrate 104 upon thermally treating the intermediate structure 130.

Optionally, in some embodiments, a layer of dielectric material (not shown) may be formed over the layer of semiconductor material 110 after separating the layer of semiconductor material 110 and, optionally, the portion 106' of the underlying intermediate layer of semiconductor material 106. As previously described with respect to FIG. 2, the layer of dielectric material may comprise, for example, silicon dioxide or silicon nitride, and may be formed by methods known in the art. The layer of dielectric material 108 may be formed over the layer of semiconductor material 110 to achieve a high-quality, planar layer of semiconductor material 110 upon subsequent processes of the invention, i.e., post strain relaxation processes.

Figure 5:
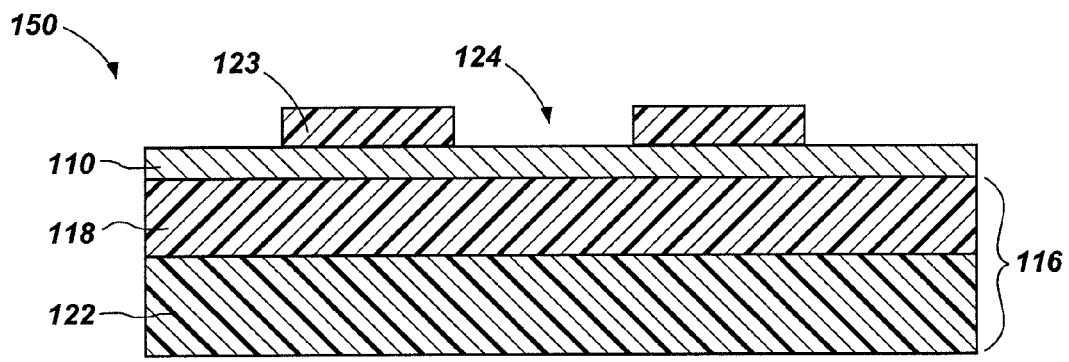
FIG. 5 is a simplified cross-sectional view of an intermediate structure that may be formed during embodiments of methods of the present invention that includes a layer of semiconductor material attached to a bonding substrate after removal of a sacrificial substrate, as shown in FIG. 4, and a patterned mask material overlying regions of the layer of semiconductor material.

As shown in FIG. 5, a mask material 123 may be formed and processed (e.g., patterned) over the layer of semiconductor material 110 and, optionally, in some embodiments, the intermediate layer of semiconductor material 106 or the layer of dielectric material 108 (FIG. 2) to form the intermediate structure 150. The mask material 123 may be selected based on the desired etch depth and resistance with respect to underlying materials, such as the layer of semiconductor material 110 and the intermediate layer of semiconductor material 106. As a non-limiting example, the mask material 123 may comprise a photoresist material or a hard mask material, such as an oxide material, a nitride material, or a metal material (i.e., chromium or titanium). A plurality of apertures 124, each exposing a surface of the layer of semiconductor material 110, may then be formed by patterning the mask material 123 using methods known in the art.

Figure 6:
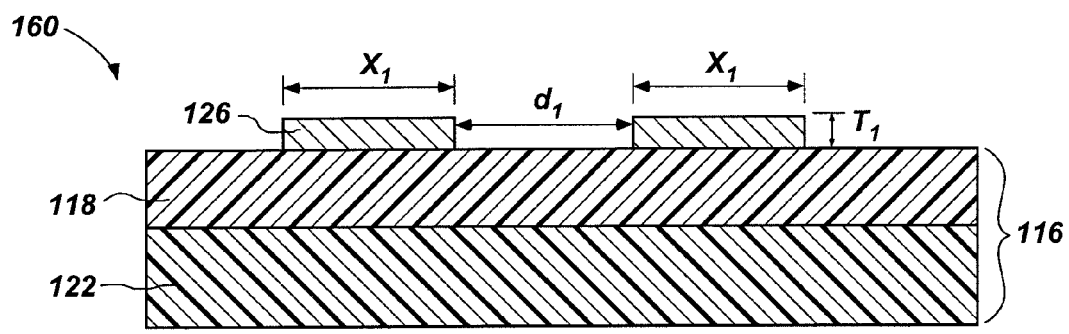
FIG. 6 is a simplified cross-sectional view of another intermediate structure that may be formed during embodiments of methods of the present invention and that includes islands of a semiconductor material disposed on a bonding substrate after removal of portions of the layer of semiconductor material selective to the mask material, as shown in FIG. 5.

As shown in FIG. 6, a portion of the layer of semiconductor material 110 may be removed through the apertures 124 in the mask material 123 using, for example, an anisotropic reactive ion (i.e., plasma) etching process, a high density plasma etching process, such as an inductively coupled plasma (ICP) etching process, or a wet etching process, to form a plurality of structures 126 of the semiconductor material. As a non-limiting example, the layer of semiconductor material 110 may be indium gallium nitride, the layer of compliant material 118 may be borophosphosilicate glass, the mask material 123 may be a photoresist and a chlorine based plasma etch process (e.g., ICP) may be used to remove the indium gallium nitride selective to the borophosphosilicate glass and the photoresist to form structures 126 comprising indium gallium nitride. After formation of the structures 126, the remaining mask material 123 may be removed from the semiconductor structure 160.

Each of the structures 126 may comprise a region of semiconductor material protruding from an underlying region. The structures 126 may be formed to have a thickness $T_1$ that is greater than or less than to a critical thickness of a layer of the semiconductor material 110, a lateral dimension $X_1$ of between about 5 µm to about 1 mm, and more particularly, about 500 µm, and may be spaced apart from adjacent structures 126 by a distance $d_1$ of between about 1 µm and 100 µm.

Figure 7:
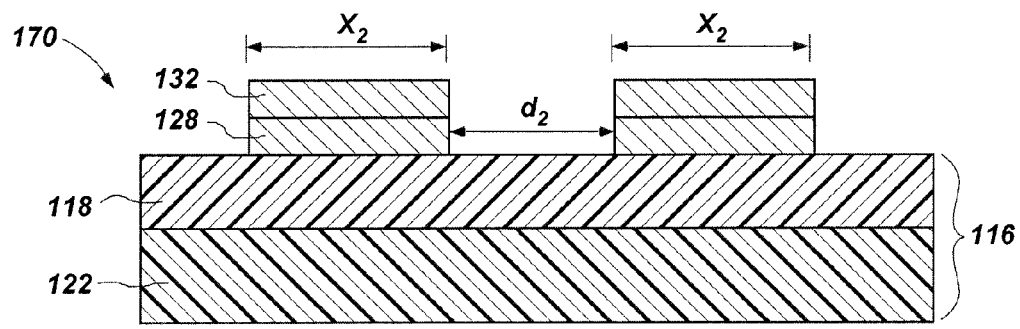
FIG. 7 is simplified cross-sectional view of a semiconductor structure or device that may be formed during embodiments of methods of the present invention and that includes a plurality of islands of a semiconductor material disposed on a compliant material.

Referring to FIG. 7, the layer of compliant material 118 may be heated using, for example, an oven, furnace, or deposition reactor, to a temperature sufficient to decrease a viscosity of the layer of compliant material 118 to reflow of the layer of compliant material 118 causing the semiconductor material structures 126, as shown in FIG. 6, to at least partially relax the semiconductor material and form base structures 128. A suitable temperature may be determined based on the composition of the layer of compliant material 118 and the desired change in viscosity. In some embodiments, the layer of compliant material 118 may be heated during the deposition of another layer of semiconductor material 132. The another layer of semiconductor material 132 may include a single layer of semiconductor material or multiple layers of semiconductor material. As a non-limiting example, the another layer of semiconductor material 132 may include a III-V type semiconductor material and the layer of compliant material 118 may be formed from a material which acts as an anti-surfactant to growth of the III-V type semiconductor material, such as a glass material, and therefore substantially prevents growth of the III-V nitride material thereon. For example, the another layer of semiconductor material 132 may be $In_yGa_{1-y}N$, wherein y represents a number between 0.01 and 0.15 such as, for example, 0.05 and 0.10.

The another layer of semiconductor material 132 may be deposited, for example, using a high temperature process such as metalorganic chemical vapor deposition (MOCVD), molecular beam epitaxy (MBE), or metalorganic vapor phase epitaxy (MOVPE), which is performed at a temperature sufficient to decrease the viscosity of the layer of compliant material 118. By way of non-limiting example, the another layer of semiconductor material 132 may be deposited at a temperature of greater than or equal to a glass transition temperature ($T_g$) of the layer of compliant material 118, at which point the viscosity of the layer of compliant material 118 is decreased and begins to reflow. The layer of compliant material 118 may be selected so that it may be reflowed or otherwise softened at a temperature of greater than or equal to about the deposition temperature of the another layer of semiconductor material 132. As a non-limiting example, the layer of compliant material 118 may comprise borophosphosilicate glass (BPSG) and the another layer of semiconductor material 132 may be formed at a temperature determined based on the percentage content of boron and phosphorous. More particularly, where the layer of compliant material 118 is borophosphosilicate glass comprising 4% by weight boron and 4% by weight phosphorous, the semiconductor structure 160 may be exposed to a temperature of greater than about 600° C. during deposition of the another layer of semiconductor material 132. By heating the semiconductor structure 160 to a temperature sufficient to reflow the layer of compliant material 118 simultaneously with the deposition of the another layer of semiconductor material 132, the crystal lattice structure of the semiconductor material of structures 126, as shown in FIG. 6, may reorganize to form base structures 128 having substantially reduced lattice strain.

The another layer of semiconductor material 132 may comprise a material having a larger lattice structure in comparison to the underlying structure 126 and, therefore, may create a force on the structures 126 while the layer of compliant material 118 is in a viscous and moveable state, which may cause the underlyling semiconductor material to at least partially relax forming base structures 128. By way of non-limiting example, where the structures 126 and the another layer of semiconductor material 132 each comprise indium gallium nitride, the another layer of semiconductor material 132 may have a higher indium content in comparison to that of the structures 126 and, thus, a larger lattice structure in comparison to the structures 126. The larger lattice structure of the another layer of semiconductor material 132 may create a force that "pushes" or "pulls" the underlying semiconductor material in relation to the layer of compliant material 118 such that the base structures 128 adopt the lattice structure and atomic ordering of the another layer of semiconductor material 132. Therefore, the another layer of semiconductor material 132 may be formed having a higher quality and greater thickness than using conventional deposition techniques. By depositing the another layer of semiconductor material 132 over the base structures 128, a strain balance may be obtained between the another layer of semiconductor material 132 and the base structures 128 enabling formation of an at least partially relaxed or relaxed, high quality layer of semiconductor material.

By way of non-limiting example, if the structures 126, as shown in FIG. 6, each comprise indium gallium nitride and the compliant material 118 comprises borophosphosilicate glass, indium gallium nitride may be deposited at or above a temperature at which the borophosphosilicate glass may be reflowed to cause expansion of the indium gallium nitride to form base structures 128. Alternatively, the structures 126 may each comprise aluminum gallium nitride and may contract (not shown) during reflow of the borophosphosilicate glass.

Thus, the another layer of semiconductor material 132 may be deposited having a lattice structure that substantially conforms with the lattice structure of the base structures 128. By forming the another layer of semiconductor material 132 while simultaneously reflowing the layer of compliant material 118, the another layer of semiconductor material 132 may be deposited above a critical thickness thereof and may include a higher percentage of indium than can conventionally be deposited without defect formation and phase separation.

The another layer of semiconductor material 132 may be an indium gallium nitride material having a sufficient indium content to form a light emitting device, such as a diode. As a non-limiting example, the structures 126, as shown in FIG. 6, may comprise a III-nitride material including about 10 percent indium ($In_{0.1}Ga_{0.9}N$) and the another layer of semiconductor material 132 may comprise a III-nitride material including about 25 percent indium ($In_{0.25}Ga_{0.75}N$), which imparts the another layer of semiconductor material 132 with a larger natural lattice structure than the structures 126. The layer of $In_{0.25}Ga_{0.75}N$ may be deposited by metalorganic chemical vapor deposition (MOCVD) at a temperature of about or greater than about 600° C. and, more particularly, in a range extending from about 700° C. to about 1150° C., while the layer of compliant material 118 comprises borophosphosilicate glass and is reflowed to cause expansion of the underlying base structure 128. In this way, the layer of $In_{0.25}Ga_{0.75}N$ may be relaxed during deposition, which facilitates formation of an at least partially relaxed layer having an increased thickness and an increased indium content, while reducing undesirable phase separation.

Thus, another layer of semiconductor material 132 may be deposited on a semiconductor structure 170 in a relaxed state or partially relaxed state. In some embodiments, prior to formation of the relaxed structures, the exposed dielectric material 118 may be selectively removed from the semiconductor structure 170.

Figure 8:
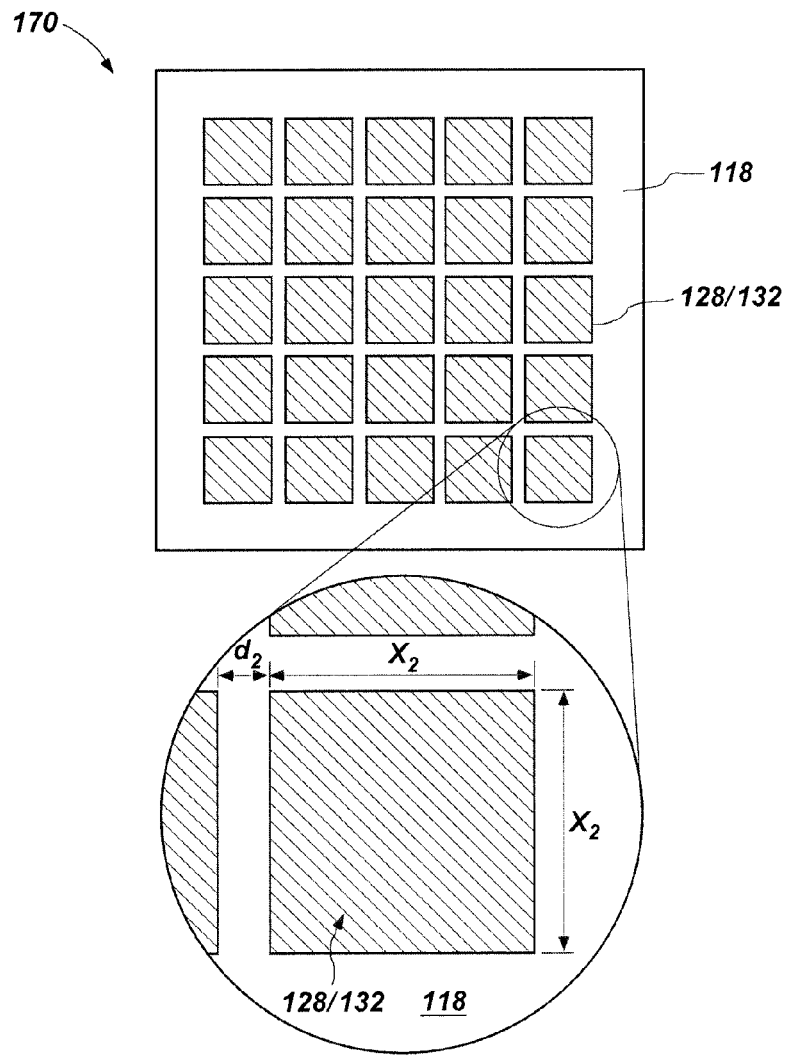
FIG. 8 is a top-down plan view of a semiconductor structure or device that includes a plurality of islands of a semiconductor material on a compliant material as shown in FIG. 7.

FIG. 8 is a top-down plan view of the semiconductor structure 170 shown in FIG. 7. During reflow of the layer of compliant material 118, the relaxing process may progress from the peripheral regions to the center regions of the structures, which may result in expansion of base structures 128. Altering the viscosity of the layer of compliant material 118 may lead to reorganization of the atoms within the semiconductor material, forming a plurality of base structures 128 having a lateral dimension $X_2$ greater than a lateral dimension $X_1$ of the structures 126 of semiconductor material (FIG. 6). The base structures 128 may be separated from one another by a distance $d_2$ that may be less than the distance $d_1$ between the structures 126 prior to relaxation. The base structures 128 may exhibit substantially reduced or eliminated compressive or tensile lattice strain in comparison to the layer of semiconductor material 110 (FIG. 1). As a non-limiting example, each of the base structures 128 may have a lateral dimension (i.e., a width or length) $X_2$ of between about 10 μm and about 250 μm and may be spaced apart from adjacent base structures 128 by a distance $d_2$ of between about 0.5 μm and about 30 μm. The dimensions and spacing of the base structures 128 may be selected to correspond to the desired size of the semiconductor structure or device being fabricated. By way of non-limiting example, for fabrication of light emitting diodes the diode size (i.e., die size) may be about 100 μm in width and 100 μm in length. Similarly, dimensions of the structures may be designed to correspond to the width and length of the desired cavity structure for laser diode fabrication.

For example, using embodiments of methods of the present invention described above, an engineered substrate (such as, for example, the intermediate structure 100 shown in FIG. 1) may be formed to include an exposed seed layer of semiconductor material 106 comprising Ga-polar gallium nitride overlying a sapphire substrate. The seed layer of semiconductor material 106 may be used to grow an epitaxial layer of Ga-polar indium gallium nitride $In_{0.15}Ga_{0.85}N$ 110 thereon. An ion implantation process may be performed to form an ion implant layer 112 defining a zone of weakness (as previously described with respect to FIG. 1). The epitaxial layer of Ga-polar indium gallium nitride $In_{0.15}Ga_{0.85}N$ 110 may be wafer-bonded to a borophosphosilicate glass layer overlying another sapphire substrate. A portion of the epitaxial layer of indium gallium nitride $In_{0.15}Ga_{0.85}N$ may be detached from the seed layer of semiconductor material 106 along the zone of weakness created during the ion implantation process so that epitaxial layer of N-polar indium gallium nitride $In_{0.15}Ga_{0.85}N$ remains on the another sapphire substrate. A mask material 123 is applied and patterned to overlie regions of the epitaxial layer of N-polar indium gallium nitride $In_{0.15}Ga_{0.85}N$ where it is desired to form structures 126. A dry etching process (i.e., plasma etching process) may be performed to remove portions of the epitaxial layer of N-polar indium gallium nitride $In_{0.15}Ga_{0.85}N$ selective to the mask material 123 and the seed layer of semiconductor material 106. Remaining portions of the mask material 123 may be removed after formation of the indium gallium nitride $In_{0.15}Ga_{0.85}N$ structures. The semiconductor structure may be thermally treated at a temperature sufficient to reflow the borophosphosilicate glass layer causing relaxation of the N-polar indium gallium nitride $In_{0.15}Ga_{0.85}N$ in the structures, as previously discussed with respect to FIGS. 7 and 8.

As another example, an engineered substrate (such as, for example, the intermediate structure 100 shown in FIG. 1) may be formed to include an exposed seed layer of semiconductor material 106 comprising Ga-polar gallium nitride overlying a sapphire substrate. The seed layer of semiconductor material may be attached to a second sapphire substrate using a conventional wafer-bonding process and the initial sapphire substrate may be removed using a conventional laser lift-off process so that the seed layer of semiconductor material 106 comprises N-polar gallium nitride. An epitaxial layer of N-polar indium gallium nitride $In_{0.15}Ga_{0.85}N$ may be formed over the seed layer of semiconductor material 106. The epitaxial layer of N-polar indium gallium nitride $In_{0.15}Ga_{0.85}N$ may be bonded to a borophosphosilicate glass layer overlying a third sapphire substrate and the epitaxial layer of N-polar indium gallium nitride $In_{0.15}Ga_{0.85}N$ may be removed from the second sapphire substrate using a conventional laser lift-off process so that a layer of Ga-polar indium gallium nitride $In_{0.15}Ga_{0.85}N$ remains on the third sapphire substrate. A dry etching process (i.e., plasma etching process) may be performed to remove portions of the epitaxial layer of N-polar indium gallium nitride $In_{0.15}Ga_{0.85}N$ selective to the mask material 122 and the seed layer of semiconductor material 106 forming structures 126 comprising N-polar indium gallium nitride $In_{0.15}Ga_{0.85}N$. After formation of the structures 126, the remaining portions of the mask material 122 may be removed after formation of the structures 126. The semiconductor structure may be thermally treated at a temperature sufficient to reflow the borophosphosilicate glass layer causing relaxation of the N-polar indium gallium nitride $In_{0.15}Ga_{0.85}N$ in the structures, as previously discussed with respect to FIGS. 7 and 8. Additionally, the semiconductor structure may be placed in an MOCVD reactor and a layer of indium gallium nitride may be deposited while the borophosphosilicate glass is simultaneously reflowed at a temperature of greater than about 700° C.

Although embodiments of the present invention have been primarily described herein with reference to layers of semiconductor material 110 comprising indium gallium nitride, the present invention is not so limited, and embodiments of the present invention may be used to provide layers of semiconductor material comprising other III-nitride materials, layers of other III-V type semiconductor materials, or layers of other semiconductor materials (such as, for example, layer of II-VI type semiconductor materials, layers of silicon, and layers of germanium).

While the present invention has been described herein with respect to certain preferred embodiments, those of ordinary skill in the art will recognize and appreciate that it is not so limited. Rather, many additions, deletions and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. A method of fabricating a semiconductor structure or device, comprising:
    forming a layer of semiconductor material over a base layer;
    affixing the layer of semiconductor material to a layer of compliant material;
    separating the layer of semiconductor material and the base layer;
    removing a portion of the layer of semiconductor material to expose regions of the layer of compliant material between each of a plurality of structures comprising the semiconductor material; and
    depositing another layer of semiconductor material over the plurality of structures while altering a viscosity of the layer of compliant material.

2. The method of claim 1, further comprising applying a layer of dielectric material over the layer of semiconductor material.

3. The method of claim 1, wherein affixing the layer of semiconductor material to a layer of compliant material comprises bonding a layer of indium gallium nitride to a layer of material comprising at least one of a low temperature oxide, a phosphosilicate glass, a borosilicate, a borophosphosilicate glass, a polyimide, a siloxane spin-on-glass, an inorganic spin-on-glass, or a silicate to the layer of indium gallium nitride.

4. The method of claim 1, wherein depositing another layer of semiconductor material over the plurality of structures while altering a viscosity of the layer of compliant material comprises depositing the another layer of semiconductor material at a temperature at or above a glass transition temperature of the layer of compliant material.

5. The method of claim 4, wherein depositing the another layer of semiconductor material at a temperature at or above a glass transition temperature of the layer of compliant material comprises depositing indium gallium nitride at a temperature in a range of from about 600° C. to about 1150° C.

6. The method of claim 1, wherein depositing another layer of semiconductor material over the plurality of structures while altering a viscosity of the layer of compliant material comprises relaxing the semiconductor material within each of the structures of the plurality while maintaining separation therebetween.

7. The method of claim 1, further comprising forming the plurality of structures to comprise a III-V type semiconductor material.

8. The method of claim 1, further comprising forming the plurality of structures to comprise $In_{0.10}Ga_{0.90}N$ and selecting the another layer of semiconductor material to comprise $In_{0.25}Ga_{0.75}N$.

9. The method of claim 1, wherein depositing another layer of semiconductor material comprises depositing a layer of indium gallium nitride having an increased critical thickness in comparison to a layer of indium gallium nitride formed on a conventional substrate.

10. A method of fabricating a semiconductor structure or device, comprising:
    forming an epitaxial layer of indium gallium nitride over a layer of borophosphosilicate glass;
    removing portions of the epitaxial layer of indium gallium nitride to form a plurality of openings therein; and
    depositing another layer of indium gallium nitride over the epitaxial layer of indium gallium nitride at a temperature at or above a glass transition temperature of the layer of borophosphosilicate glass.

11. The method of claim 10, wherein depositing another layer of indium gallium nitride over the epitaxial layer of indium gallium nitride comprises depositing a layer of $In_{0.25}Ga_{0.75}N$ over a layer of $In_{0.1}Ga_{0.9}N$.

12. The method of claim 10, wherein depositing another layer of indium gallium nitride over the epitaxial layer of indium gallium nitride at a temperature at or above a glass transition temperature of the layer of borophosphosilicate glass comprises depositing the another layer of indium gallium nitride over the epitaxial layer of indium gallium nitride at a temperature of about 600° C. or greater.

13. The method of claim 10, further comprising depositing a third layer of indium gallium nitride over the another layer of indium gallium nitride at a temperature at or above a glass transition temperature of the layer of borophosphosilicate glass.

14. A method of fabricating a semiconductor structure or device, comprising:
    forming a layer of III-V type semiconductor material on an intermediate material overlying a first substrate;

attaching the layer of III-V type semiconductor material to a layer of material overlying a second substrate;

removing the layer of III-V type semiconductor material from the first substrate after attaching the second substrate to the layer of III-V type semiconductor material;

removing portions of the layer of III-V type semiconductor material to form a plurality of structures, each structure of the plurality being separated from adjacent structures by exposed regions of the layer of material; and heating the layer of material to decrease a viscosity thereof.

15. The method of claim 14, wherein forming a layer of III-V type semiconductor material on an intermediate material overlying a first substrate comprises depositing a layer of indium gallium nitride.

16. The method of claim 14, wherein attaching the layer of III-V type semiconductor material to the second substrate comprises bonding the layer of III-V semiconductor type material to the layer of material.

17. The method of claim 14, wherein removing the layer of III-V type semiconductor material from the first substrate comprises:

implanting ions into at least one of the layer of III-V type semiconductor material and the first substrate to form an ion implant layer; and delaminating the layer of III-V type semiconductor material from the first substrate along the ion implant layer.

18. The method of claim 14, further comprising selecting the layer of material to comprise a material capable of being reflowed.

19. The method of claim 14, wherein heating the layer of material to decrease a viscosity thereof comprises depositing another layer of III-V type semiconductor material over the plurality of structures at a temperature sufficient to reflow the layer of material.

20. The method of claim 19, wherein depositing another layer of III-V type semiconductor material over the plurality of structures at a temperature sufficient to reflow the layer of material comprises depositing $In_{0.25}Ga_{0.75}N$ over a plurality of structures comprising $In_{0.15}Ga_{0.85}N$ at a temperature in a range of from about 750° C. to about 1150° C.

21. The method of claim 19, wherein depositing another layer of III-V type semiconductor material over the plurality of structures at a temperature sufficient to reflow the layer of material comprises depositing $In_xGa_{1-x}N$ over a plurality of structures comprising $In_yGa_{1-y}N$ at a temperature in a range of from about 750° C. to about 1150° C., wherein x and y independently represent a number of between 0.01 and 0.15.

22. A method of forming an engineered substrate, comprising:

growing an epitaxial layer of indium gallium nitride on a substrate;

attaching the layer of indium gallium nitride to a layer of a flowable material overlying another substrate on a side thereof opposite the substrate;

separating the substrate from the layer of indium gallium nitride;

removing portions of the layer of indium gallium nitride to form a plurality of structures comprising indium gallium nitride; and depositing another layer of indium gallium nitride at a temperature sufficient to reflow the layer of flowable material.

23. The method of claim 22, wherein growing an epitaxial layer of indium gallium nitride on a substrate comprises growing the epitaxial layer of indium gallium nitride on a layer of gallium nitride formed on the base material of the substrate.

24. The method of claim 22, wherein attaching the another substrate to the layer of indium gallium nitride comprises attaching the another substrate to a layer of material comprising at least one of a low temperature oxide, a phosphosilicate glass, a borosilicate, a borophosphosilicate glass, a polyimide, a siloxane spin-on-glass, an inorganic spin-on-glass, or a silicate to the layer of indium gallium nitride.

25. The method of claim 22, further comprising selecting the another layer of indium gallium nitride to comprise a higher percentage of indium than the layer of indium gallium nitride.

* * * * *